(12) United States Patent
Kohno

(10) Patent No.: US 6,426,585 B1
(45) Date of Patent: Jul. 30, 2002

(54) THICKNESS OR LENGTH POLARIZED PIEZOELECTRIC TRANSFORMER

(76) Inventor: Kazuo Kohno, 332-30 Shitengi, Ohami Shirasato-machi, Sanbu-gun, Chiba-pref. (JP)

( * ) Notice: Subject to any disclaimer, the term of this patent is extended or adjusted under 35 U.S.C. 154(b) by 0 days.

(21) Appl. No.: 09/714,995

(22) Filed: Nov. 20, 2000

(30) Foreign Application Priority Data

Dec. 8, 1999 (JP) ............................................. 11-348389

(51) Int. Cl.[7] ..................... H01L 41/04; H01L 41/08; H01L 41/18; H02N 2/00
(52) U.S. Cl. ...................................... 310/314; 310/357
(58) Field of Search ................................. 310/314, 357

(56) References Cited

U.S. PATENT DOCUMENTS

| | | | | |
|---|---|---|---|---|
| 3,610,969 A | * | 10/1971 | Clawson et al. | 310/8.1 |
| 4,016,437 A | * | 4/1977 | Calderara et al. | 310/8.7 |
| 4,608,509 A | * | 8/1986 | Yamamoto et al. | 310/357 |
| 5,118,982 A | * | 6/1992 | Inoue et al. | 310/366 |
| 5,229,680 A | * | 7/1993 | Sato et al. | 310/339 |
| 5,574,414 A | * | 11/1996 | Ogawa et al. | 310/189 |
| 5,861,704 A | * | 1/1999 | Kitami et al. | 310/369 |
| 6,051,915 A | * | 4/2000 | Katsumo et al. | 310/359 |
| 6,147,439 A | * | 11/2000 | Takagi et al. | 310/365 |
| 6,182,340 B1 | * | 2/2001 | Bishop | 310/25.35 |

* cited by examiner

*Primary Examiner*—Thomas M. Dougherty
*Assistant Examiner*—Pedro J. Cuevas
(74) *Attorney, Agent, or Firm*—Wenderoth, Lind & Ponack, L.L.P.

(57) ABSTRACT

Multiple outputs can be efficiently generated in a piezoelectric transformer by utilizing both surfaces of a piezoelectric member at the primary side, and the piezoelectric member at the primary side is polarized in the direction of thickness or in the direction of length. The piezoelectric members at the secondary side applied with a polarization in the direction of thickness or in the direction of length are laminated on both surfaces of the piezoelectric member at the primary side in the direction of thickness or in the direction of length. When an alternating voltage is applied to the input terminals at the primary side, thickness vertical vibration is generated at the piezoelectric member at the primary side. The vertical wave vibration that propagates in the direction of thickness propagates to the piezoelectric members at the secondary side, and generates an alternating voltage by a piezoelectric positive effect.

3 Claims, 11 Drawing Sheets

THICKNESS OR LENGTH POLARIZED PIEZOELECTRIC TRANSFORMER

BACKGROUND OF THE INVENTION

The present invention relates to lamination-type piezoelectric transformers.

In general, the piezoelectric transformer is constructed of a sheet of a piezoelectric member 2 as shown in FIG. 9 and a drive part 2a at an input side is polarized in the direction of thickness, and a power generation part 2b at an output side is polarized in the direction of length. When alternating voltage of the direction of thickness is applied between electrode patterns 4 and 6 at the input side, a vertical vibration occurs in the direction of length in the piezoelectric member 2. The alternating voltage is generated at the power generating part 2b of the piezoelectric member 2 by the vertical vibration, and the alternating voltage is fetched from the output terminal.

The conventional piezoelectric transformers utilize only the one side of a drive unit at the input side, and do not utilize the other side. As a result, such conventional piezoelectric transformers cannot fetch the large electric current efficiently from the output side.

A primary object of the present invention is to fetch multiple outputs efficiently by utilizing both sides of the piezoelectric member at the primary side, and to solve the foregoing problems.

The above-noted piezoelectric transformer is called the Rosen type piezoelectric transformer, and is unfit for power generation due to low drive frequency and high internal impedance.

Another object of the present invention is to provide a piezoelectric transformer suitable for power generation with a small internal impedance which produces a high frequency with utilization of the thickness vertical vibration.

Furthermore, another object of the present invention is to provide a piezoelectric transformer that transmits the vertical vibration at the primary side to the secondary side efficiently and which produces a plurality of outputs efficiently with an input and which provides a large electric current from the output side.

SUMMARY OF THE INVENTION

The present invention is to fetch multiple outputs efficiently by utilizing both surfaces of the piezoelectric member at the primary side.

The primary piezoelectric member is polarized in the direction of thickness or in the direction of length. The secondary side piezoelectric members, which are polarized in the direction of thickness or in the direction of length, are laminated at both sides of the direction of thickness or length of the primary piezoelectric member. When alternating voltage is applied to an input terminal at the primary side, thickness vertical vibration occurs in the primary side piezoelectric member by a piezoelectric counter effect, which is a kind of mechanical vibration. The vertical vibration propagating in the direction of thickness is propagated to the secondary side piezoelectric member, and an alternating voltage is generated by positive effect of piezoelectricity on the secondary side piezoelectric member and this alternating voltage is transferred to the first output terminal and the second output terminal.

DETAILED DESCRIPTION OF THE INVENTION

Figure 1:
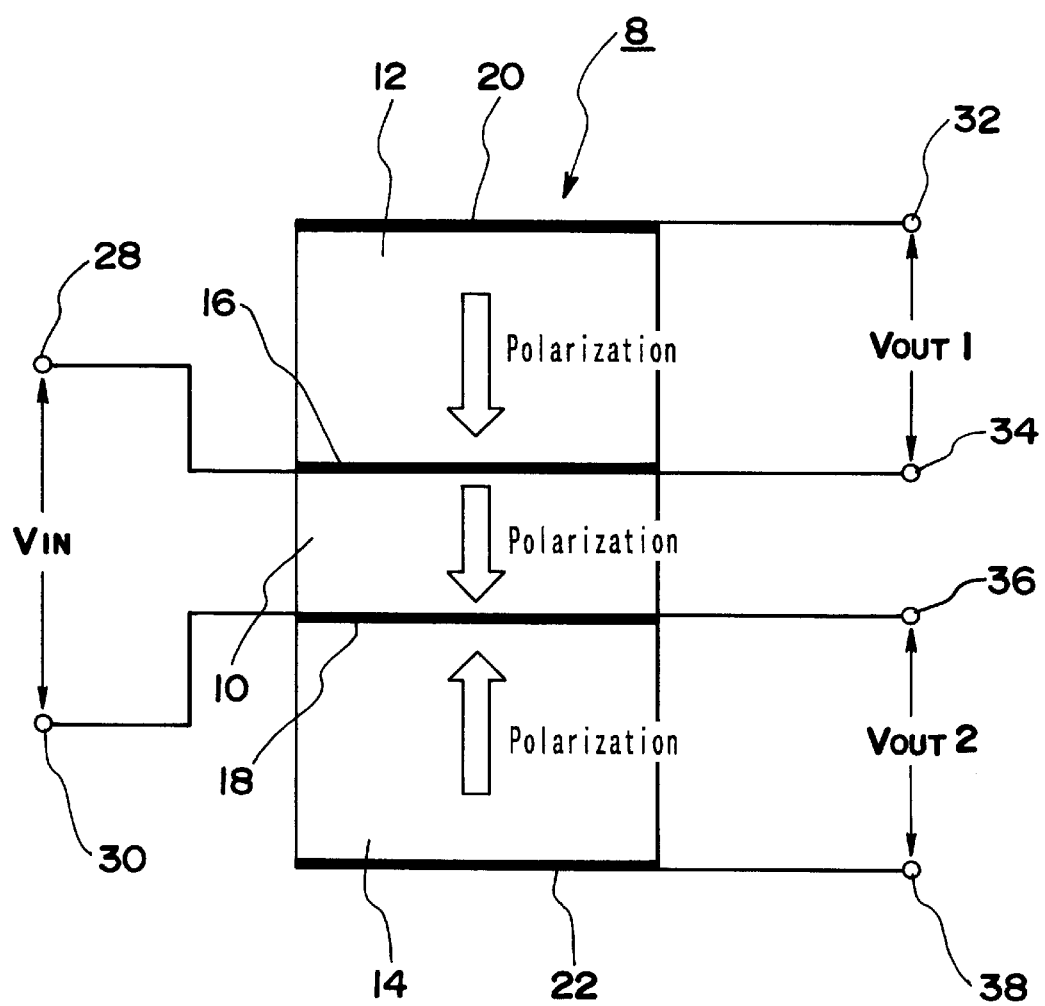
FIG. 1 is an explanatory drawing showing an embodiment of the present invention.

The mode of the embodiment of the present invention will be described in detail in the following by referring to the drawings.

FIG. 1 shows the first mode of the embodiment of a piezoelectric transformer 8 of the present invention, and reference numeral 10 denotes a piezoelectric member at the primary side, and numerals 12, 14 denote piezoelectric members at the secondary side. The piezoelectric members 10, 12, 14 are composed of a disc type piezoelectric ceramic plate.

The piezoelectric transformer 8 is constructed in such a way that the piezoelectric members 12, 14 at the secondary side are laminated in sandwich form centering the piezoelectric member 10 at the primary side. The shape of each piezoelectric member 10, 12, 14 is not limited to the disc type particularly, and may be formed in square or in any optional shape. At both end surfaces of the piezoelectric member 10 at the primary side, electrode patterns 16, 18 of silver paste are formed by a thick film screen printing method.

Similarly, at the end surface of the outside of the piezoelectric members 12 and 14 at the secondary side in the direction of thickness, electrode patterns 20, 22 are formed, respectively. In this embodiment, each piezoelectric member 10, 12, 14 is mutually bound through electrode patterns 16, 18 by a firing process, and the entire body is an integral lamination structure, but this integral lamination structure is not particularly limited to the firing process.

Figure 8:
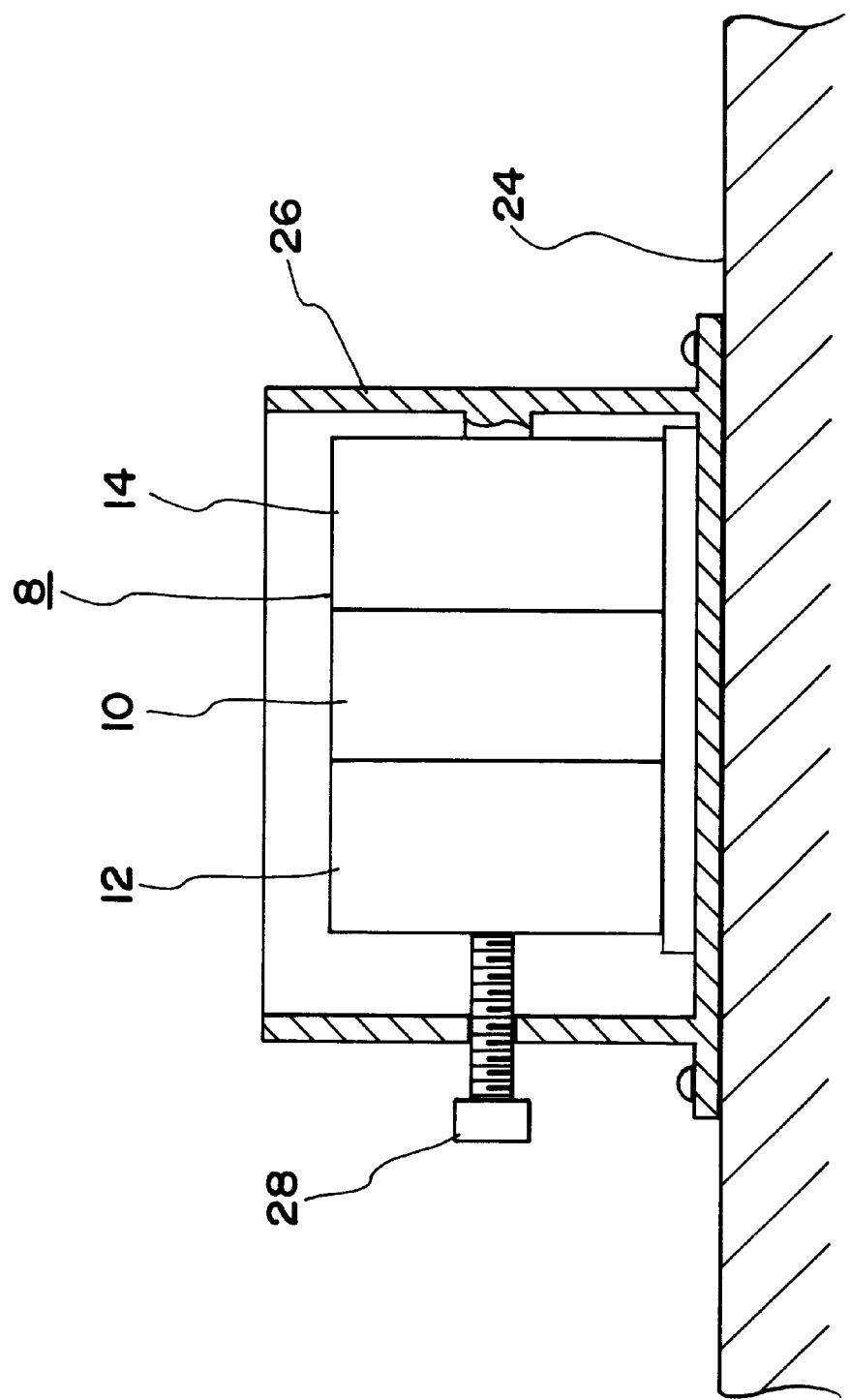
FIG. 8 is an analytical perspective view showing an embodiment mode of a piezoelectric transformer holding mechanism.
Figure 9:
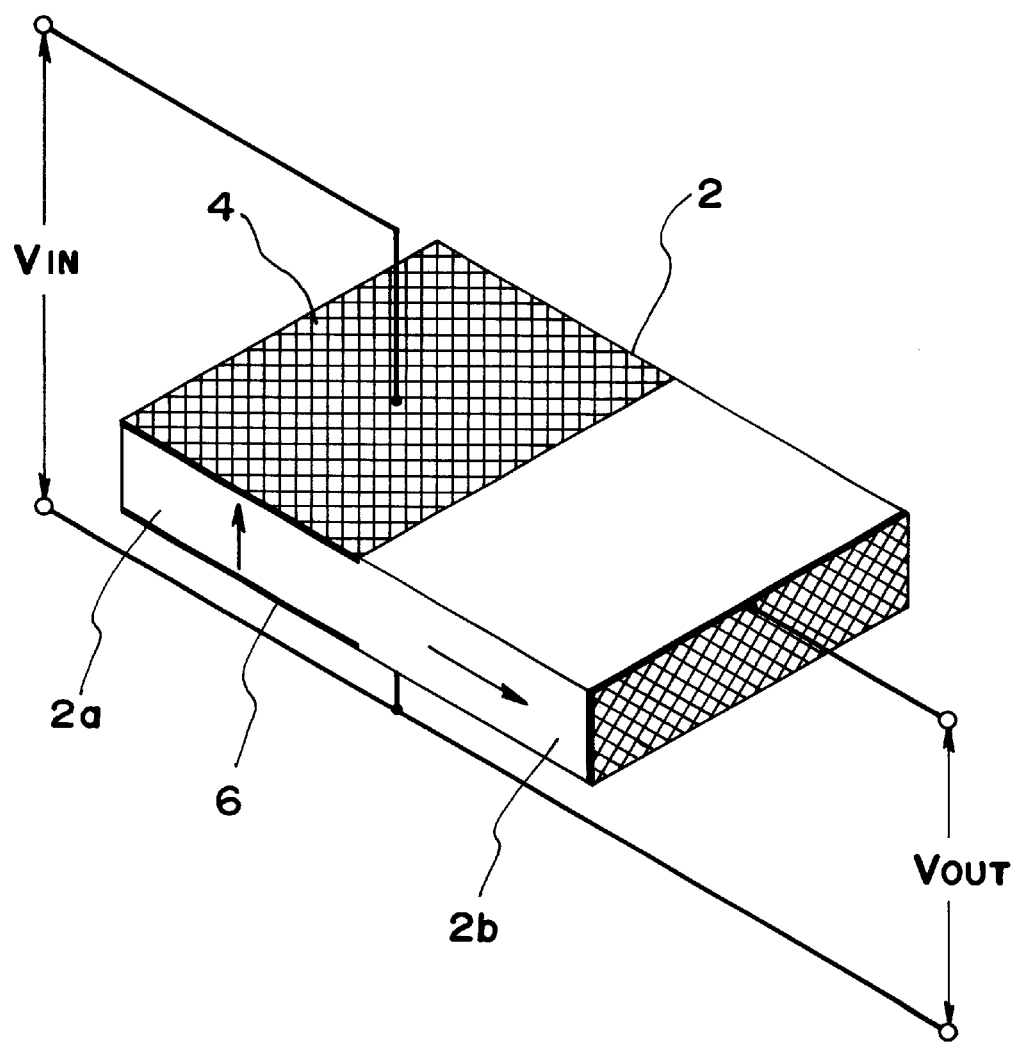
FIG. 9 is an exterior explanatory drawing of a conventional technique.

As illustrated in FIG. 8, each piezoelectric member 10, 12, 14 is put one member on another mechanically in a sandwich form in a case 26 fixed to a printed circuit board 24, and the piezoelectric members 10, 12, 14 are applied with the pressure exerted by the vibration of the piezoelectric member 10 at the primary side which can be sufficiently transmitted to the piezoelectric members 12, 14 at the secondary side by a pressure member 28 such as a bolt and the like, and both sides of the piezoelectric transformer 8 may be arranged to receive the pressure in the case 26.

Each piezoelectric member 10, 12, 14 is polarized in the direction of an arrow in the direction of thickness as shown in FIG. 1. Input terminals 28, 30 are connected to the electrode patterns 16, 18, respectively, of the piezoelectric member 10 at the primary side by means of a lead wire. The first output terminals 32, 34 are connected to the electrode patterns 20, 16, respectively, and the second output terminals 36, 38 are connected to the electrode patterns 18, 22, respectively. The thickness of the piezoelectric member 10, at the primary side, is set at 0.5 mm, and the thickness is set at 2 mm for the piezoelectric members 12, 14 at the secondary side in the embodiment of the present invention.

For reference, the direction of polarization of the piezoelectric members 12, 14 at the secondary side is not particularly limited to the direction of thickness. The polarization may be applied in the direction perpendicular to the direction of thickness of the piezoelectric members 12, 14 at the secondary side, namely, the direction of length. In this case, output electrodes are formed at both sides of the piezoelectric members 12, 14 at the secondary side in correspondence to the direction of polarization.

In the construction having polarization in the direction of thickness, when alternating voltage is applied to the input terminals 28, 30, thickness vertical vibration that is a kind of mechanical vibration is generated in the piezoelectric member 10 at the primary side by the piezoelectric counter effect. The vertical wave vibration propagating in the direction of thickness propagates to the piezoelectric members 12, 14 at the secondary side, and the alternating voltage is generated in the piezoelectric members 12, 14 by the piezoelectric positive effect, and this alternating voltage is outputted to the first output terminals 32, 34 and the second output terminals 36, 38 respectively.

Figure 2:
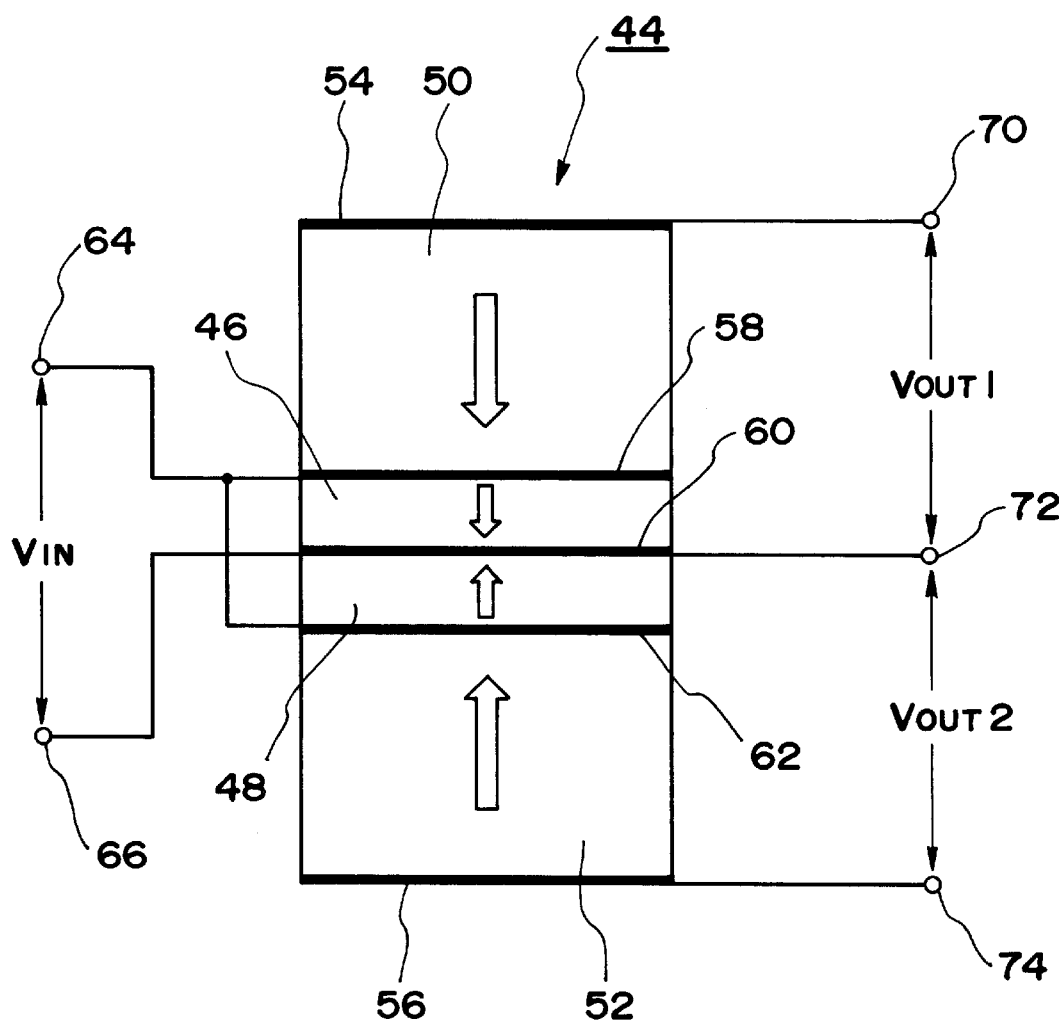
FIG. 2 is an explanatory drawing showing another embodiment of the present invention.

Furthermore, another embodiment of the present invention will be described by referring to FIG. 2.

In this embodiment, the piezoelectric member at the primary side of a piezoelectric transformer 44 is formed by two sheets of piezoelectric members 46, 48 whose thickness is identical, and piezoelectric members 50, 52 are disposed at both sides of the piezoelectric members 46, 48 at the primary side. The polarization is applied to the piezoelectric members 46, 48 at the primary side in counter direction to the direction of thickness.

The polarization is applied to a piezoelectric member 50 at the secondary side in the direction of thickness, in the same direction with the piezoelectric member 46 at the primary side, and a piezoelectric member 52 at the secondary side is polarized in the direction of thickness, in the same direction with the piezoelectric member 48 at the primary side. Electrode patterns 54, 56 are formed at an end surface of the outside of each piezoelectric member 50, 52, and electrode patterns 58, 60, 62 are formed on boundary surfaces of the piezoelectric members 50, 46, 48, 52. In case the polarization is applied to the piezoelectric members 50, 52 at the secondary side in the direction perpendicular to the direction of thickness, namely, the direction of length, electrodes are formed at both sides of the piezoelectric members 50, 52 at the secondary side.

Figure 7:
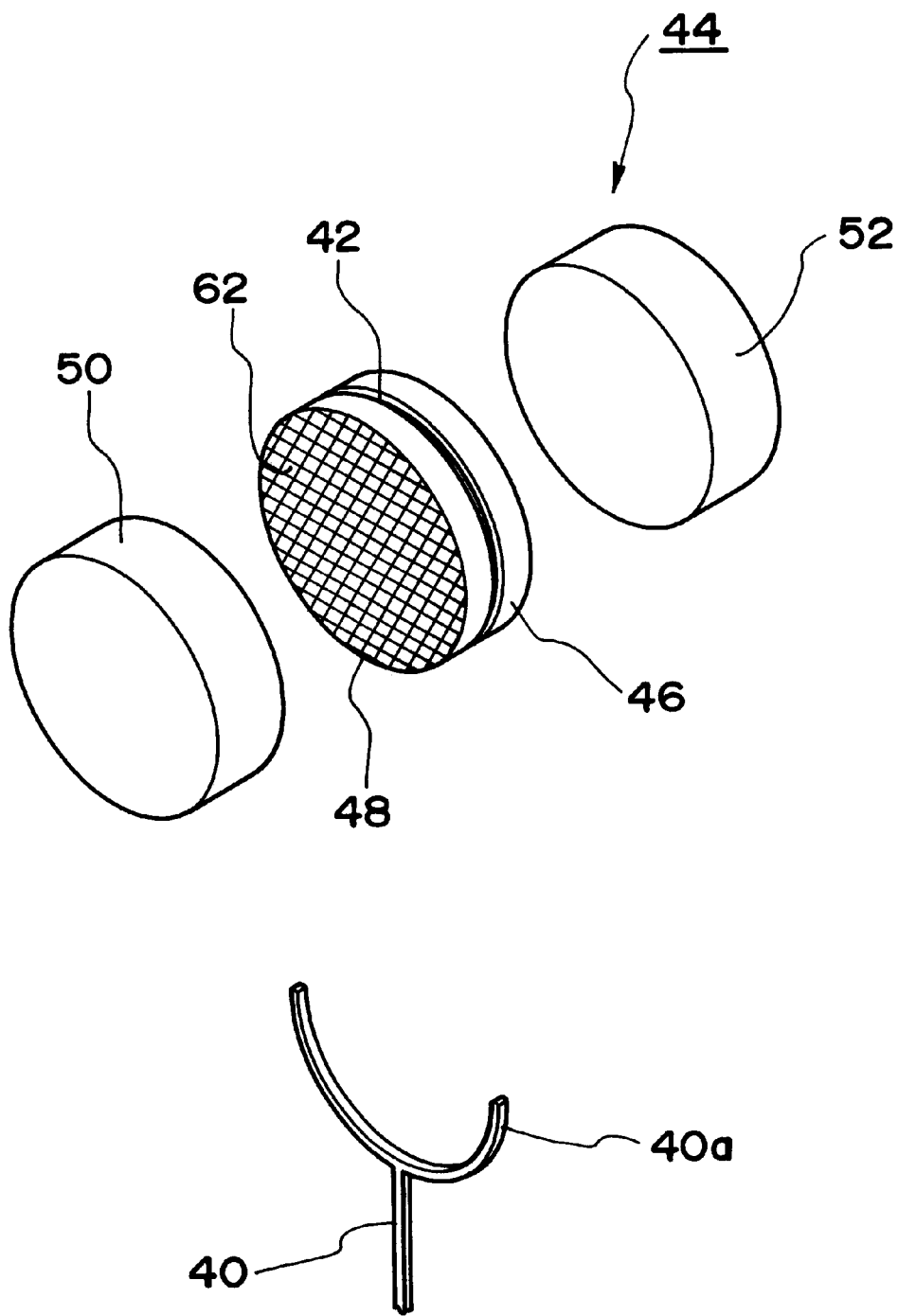
FIG. 7 is an analytical perspective view showing an embodiment mode of a piezoelectric transformer holding mechanism.

The piezoelectric members 50, 46, 48, 52 are bound and laminated integrally by a firing process through the electrode patterns 58, 60, 62. The integral laminating construction of the piezoelectric transformer 44 in the present embodiment is suitable as a mechanical pressure binding structure illustrated in FIG. 8. One terminal 64 of the input terminals 64, 66 is connected to the electrode patterns 58, 62 through a lead wire, and the other terminal 66 is connected to the electrode pattern 60 through a lead wire. As shown in FIG. 7, on the piezoelectric members 46, 48 at the primary side that are bound mutually, a ring-like groove 42 is formed in its central portion, and a holding portion 40a of a holding member 40 fits in the groove 42.

The holding member 40 is fixed to the printed circuit board, and the piezoelectric transformer 44 is retained on the printed circuit board by this holding member 40.

In the foregoing construction, when the alternating voltage is applied to the input terminals 64, 66, a vertical vibration is generated in the piezoelectric members 46, 48 at the primary side by the piezoelectric counter effect. This vertical vibration provides that the joined portion of the piezoelectric members 46, 48 at the primary side becomes a physical center. The holding member 40 can firmly and stably retain the piezoelectric transformer 44 on grounds that it holds the joined portion of the center of the vertical vibration.

The vertical wave vibration of the piezoelectric members 46, 48 at the primary side propagates to the piezoelectric members 50, 52 at the secondary side, and the alternating voltage is applied to output terminals 70, 72 and output terminals 74, 72 by the piezoelectric positive effect.

In any of the foregoing embodiments, the primary side and the secondary side are not insulated. Accordingly, in case the primary side is connected to an AC power source without being connected through a wound transformer, while the circuit grounded at the secondary side, there is an apprehension of causing a serious accident as the AC current flows to the equipment at the secondary side.

Figure 3:
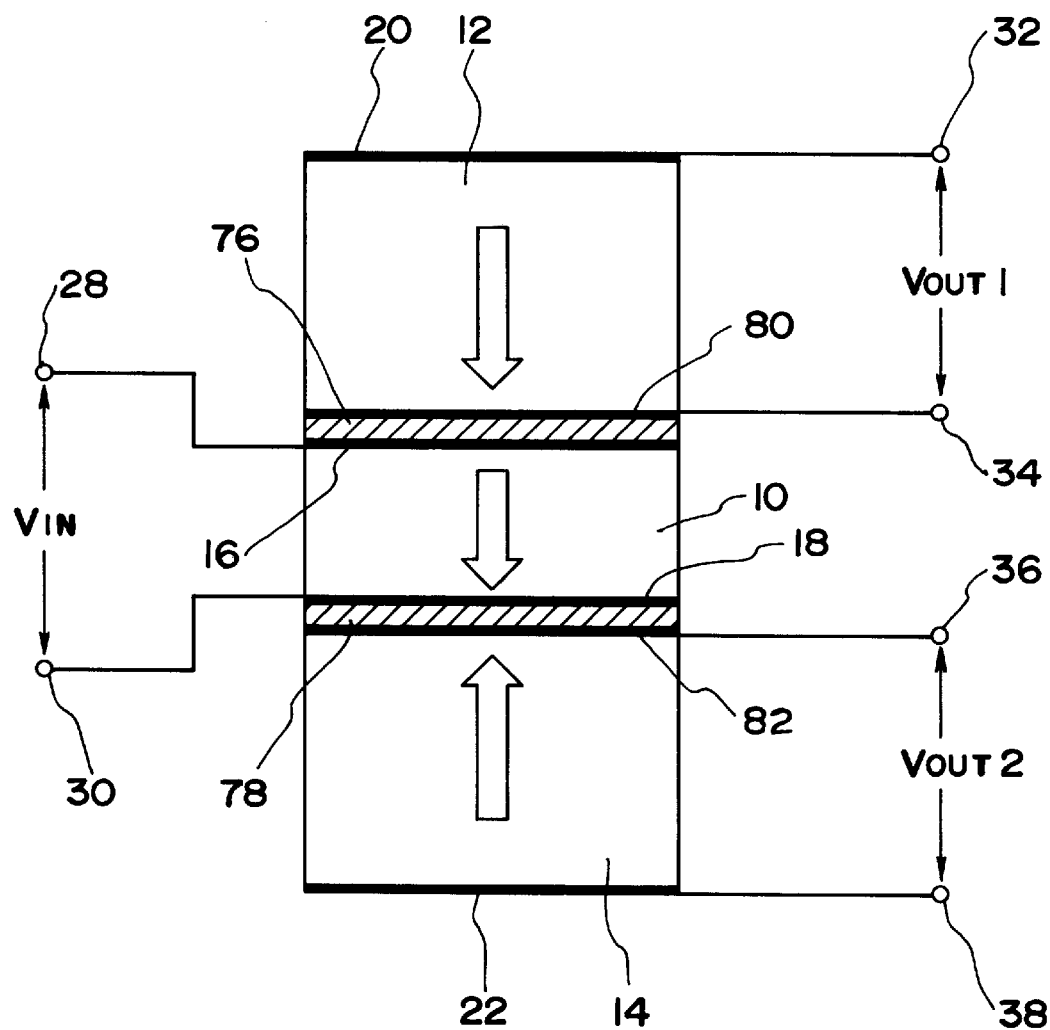
FIG. 3 is an explanatory drawing showing another embodiment of the present invention.

In order to avoid this accident, FIG. 3 shows an embodiment of the piezoelectric transformer that insulates the primary side from the secondary side.

In FIG. 3, insulated layers 76, 78 consisting of an insulating material having low permittivity such as an alumina substrate and the like are formed between the piezoelectric member 10 at the primary side and the piezoelectric members 12, 14 at the secondary side. The input terminals 28, 30 at the primary side are connected to the electrode patterns 16, 18, respectively, formed on both surfaces of the piezoelectric member 10 at the primary side, and the first output terminals 32, 34 at the secondary side are connected to the electrode patterns 20, 80, respectively, formed on both surfaces of the piezoelectric member 12 at the secondary side, and the second output terminals 36, 38 are connected to the electrode patterns 82, 22, respectively, formed on both surfaces of the piezoelectric member 14 at the secondary side.

Figure 4:
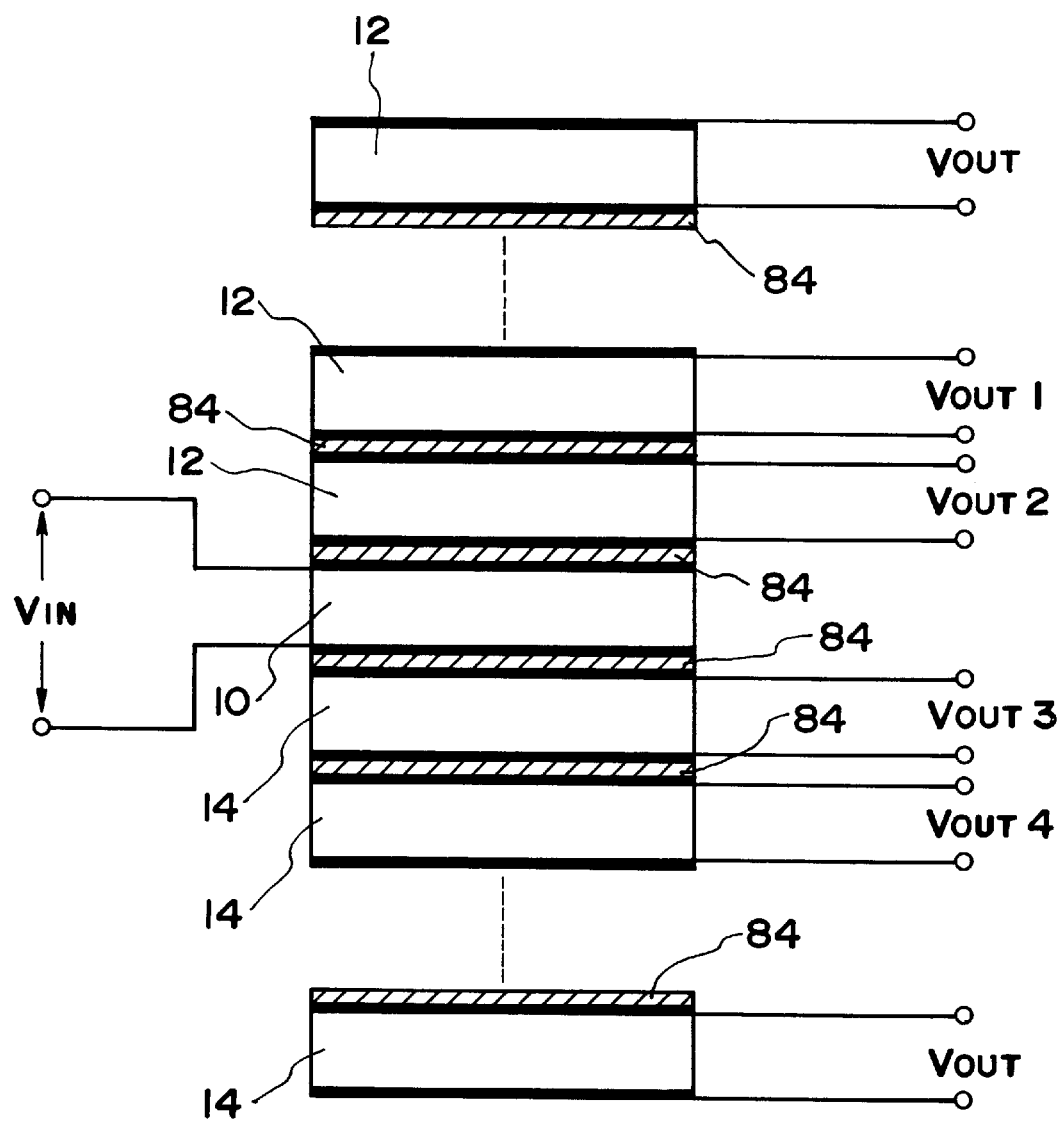
FIG. 4 is an explanatory drawing showing another embodiment of the present invention.

A plurality of the output terminals at the secondary side may be provided, as shown in FIG. 4, by laminating the piezoelectric member 14 at the secondary side on both surface sides of the piezoelectric member 10 at the primary side by means of an insulation layer 84.

Figure 5:
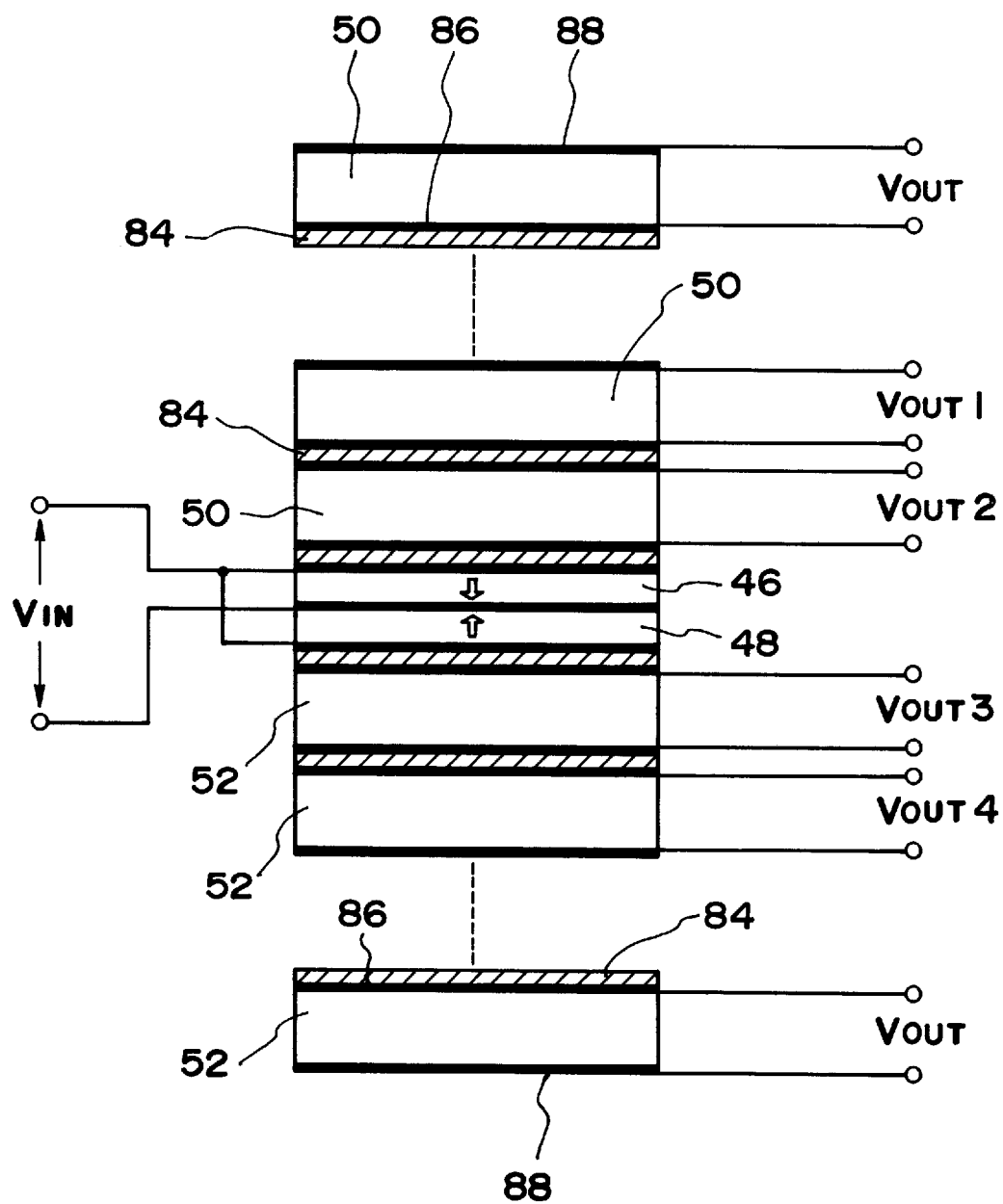
FIG. 5 is an explanatory drawing showing another embodiment of the present invention.

FIG. 5 shows an embodiment in which the primary side and the secondary side of a piezoelectric transformer with a double layer structure comprising the piezoelectric members 46, 48 at the primary side are insulated by the insulation layers 84, and a plurality of the piezoelectric members 50, 52 at the secondary side are laminated by means of the insulation layers 84, and multiple outputs are produced from the electrode patterns 86, 88 at both surfaces of the piezoelectric members 50, 52 at the secondary side.

Furthermore, a mode of an embodiment that applies to the piezoelectric transformer of this invention to the AC adaptor will be described by referring to FIG. 6.

Figure 6:
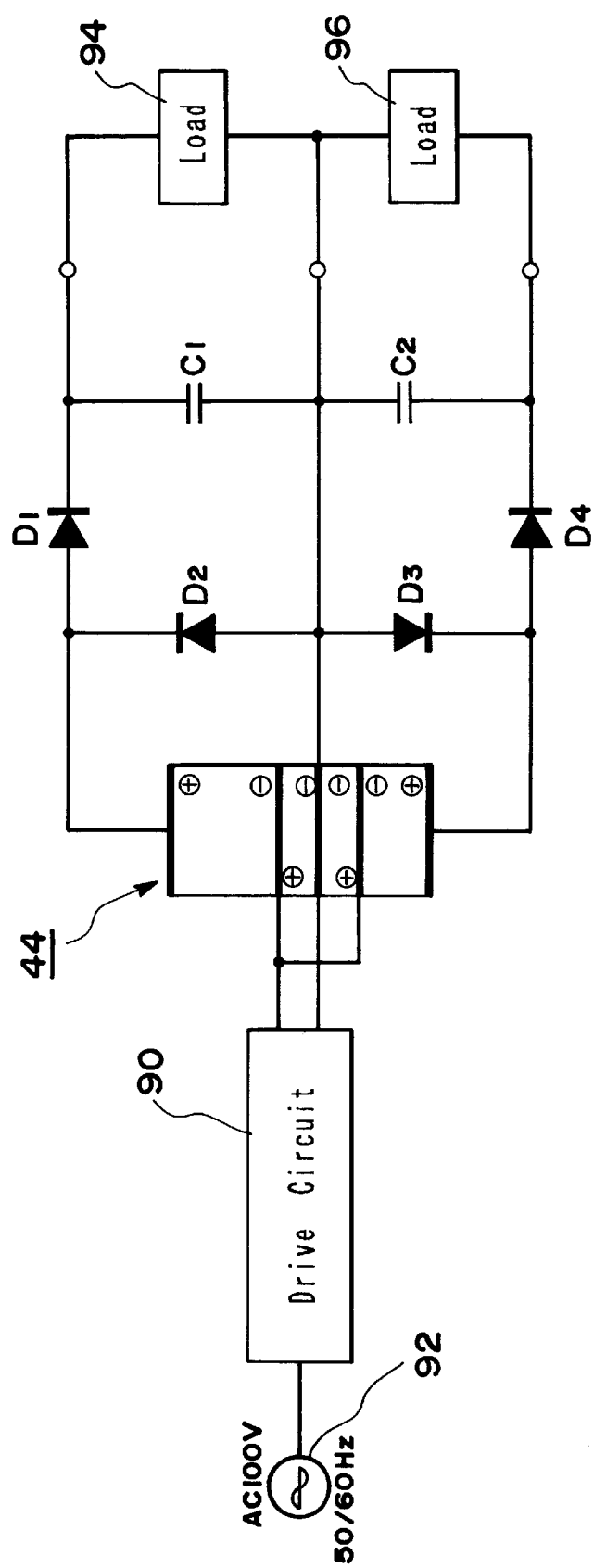
FIG. 6 is a block circuit drawing of an AC adaptor.

In FIG. 6, numeral 90 denotes a drive circuit that converts AC of 50 Hertz or 60 Hertz of an AC power source 92 to DC and converts this DC to resonance pulse signals for driving the piezoelectric transformer and supplies the signals to the input terminal of the piezoelectric member at the primary side of the piezoelectric transformer 44. The alternating voltage output of the secondary side of the piezoelectric transformer 44 is rectified by a rectifier circuit consisting of diodes D1, D2, D3, D4 respectively, and is smoothed by capacitors C1, C2 to be supplied to two loads 94, 96.

Figure 10:
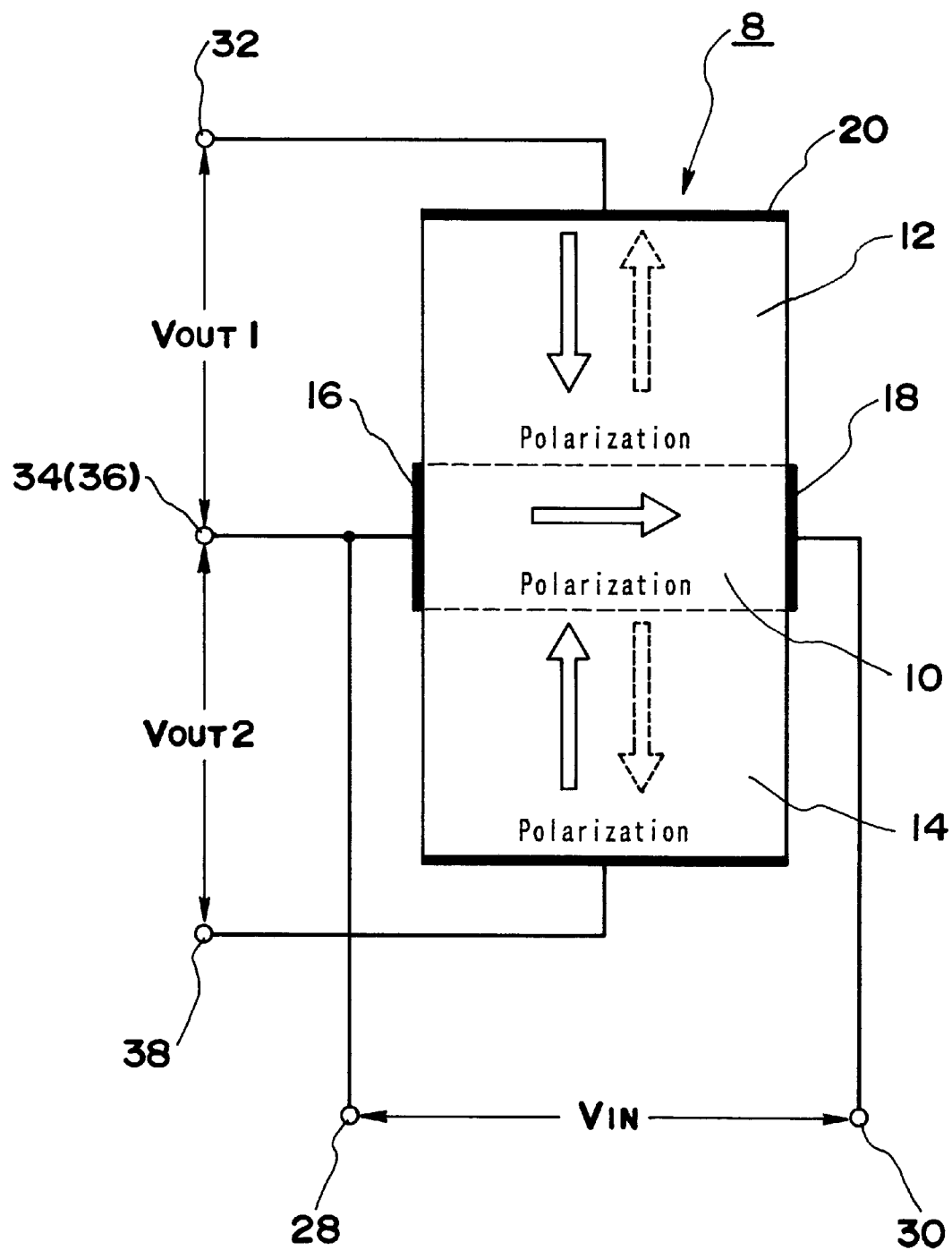
FIG. 10 is an explanatory drawing showing another embodiment of the present invention.
Figure 11:
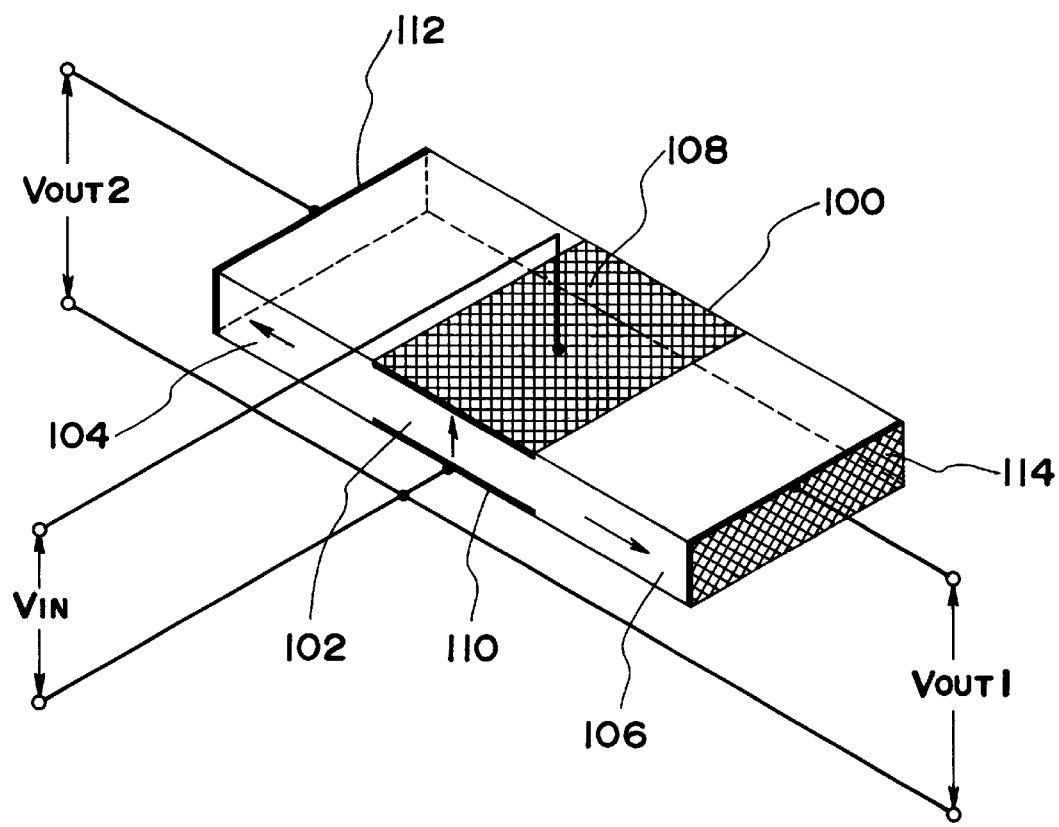
FIG. 11 is an explanatory drawing showing another embodiment of the present invention.

For reference, any of the foregoing embodiments shows an application of polarization to the piezoelectric member at the primary side in the direction of thickness, but the direction of polarization of the piezoelectric member at the primary side is not particularly limited to the direction of thickness, and as shown in FIG. 10, in a case where the direction of polarization of the piezoelectric member 10 at the primary side is made as the direction of length, the electrode patterns 16, 18 are formed at both sides of the piezoelectric member 10 at the primary side, and the electrode patterns 16, 18 are connected to the input terminals 28, 30, respectively. The outputs of the piezoelectric members 12, 14 at the secondary side are transferred from the output terminals 32, 34 and the output terminals 36, 38. As described in the foregoing, in case where the direction of polarization of the piezoelectric member 10 at the primary side is made as the direction of length, the piezoelectric layer at the primary side and a plurality of the piezoelectric layers at the secondary side may be formed in a single piezoelectric member. Furthermore, in any of the foregoing embodiments, the number of the input units at the primary side is one, but a structure in which a plurality of the piezoelectric layers at the primary side are provided and a plurality of the input units at the primary side are provided may be employed. Moreover, as shown in FIG. 11, piezoelectric layers 104, 106 at the secondary side may be laminated on both surface sides of a sheet of the piezoelectric layer 102 in the direction of thickness to transfer a plurality of outputs from outputs Vout 1, Vout 2 of the output unit. In the drawings, 108, 110, 112, 114 denote electrode patterns, and an arrow shows the direction of polarization.

As described in the foregoing, the present invention provides that the piezoelectric member at the secondary side is disposed at both surface sides of the piezoelectric member at the primary side in the direction of thickness or length so that both surfaces of the piezoelectric member at the primary side are effectively utilized and a plurality of the outputs can be generated.

What is claimed is:

1. A piezoelectric transformer comprising:

a primary-side piezoelectric member having a polarization applied in a thickness direction of said primary-side piezoelectric member or a polarization applied in a length direction of said primary-side piezoelectric member, said primary-side piezoelectric member comprising an input terminal for receiving an input voltage;

a first secondary-side piezoelectric member having a polarization applied in a thickness direction of said first secondary-side piezoelectric member or a polarization applied in a length direction of said first secondary-side piezoelectric member, said first secondary-side piezoelectric member being laminated to one side of said primary-side piezoelectric member, said first secondary-side piezoelectric member being laminated in the thickness direction of said primary-side piezoelectric member and a thickness direction of said first secondary-side piezoelectric member, or in the length direction of said primary-side piezoelectric member and a length direction of said first secondary-side piezoelectric member, said first secondary-side piezoelectric member being operable to generate an alternating voltage, said first secondary-side piezoelectric member comprising first output terminals for outputting the alternating voltage generated by said first secondary-side piezoelectric member; and a second secondary-side piezoelectric member having a polarization applied in a thickness direction of said second secondary-side piezoelectric member or a polarization applied in a length direction of said second secondary-side piezoelectric member, said second secondary-side piezoelectric member being laminated to another side, opposite to said one side, of said primary-side piezoelectric member, said second secondary-side piezoelectric member being laminated in the thickness direction of said primary-side piezoelectric member and a thickness direction of said second secondary-side piezoelectric member, or in the length direction of said primary-side piezoelectric member and a length direction of said second secondary-side piezoelectric member, said second secondary-side piezoelectric member being operable to generate an alternating voltage, said second secondary-side piezoelectric member comprising second output terminals for outputting the alternating voltage generated by said second secondary-side piezoelectric member.

2. A piezoelectric transformer according to claim 1, wherein said primary-side piezoelectric member comprises a first primary-side piezoelectric member portion and a second primary-side piezoelectric member portion laminated together in the thickness direction of said primary-side piezoelectric member, said first and second primary-side piezoelectric member portions having respective polarizations that are counter to each other in the thickness direction of said primary-side piezoelectric member.

3. A piezoelectric transformer according to claim 2, for use with a printed circuit board, said piezoelectric transformer comprising:

a holding member supporting said primary-side piezoelectric member at a boundary between said first and second primary-side piezoelectric member portions, said holding member to be erected on the printed circuit board, wherein said primary-side piezoelectric member and said first and second secondary-side piezoelectric members are integral.

* * * * *